United States Patent [19]

Ishikawa et al.

[11] 4,092,693
[45] May 30, 1978

[54] TEMPERATURE SENSING PROTECTION CIRCUIT FOR IC POWER CHIP HAVING THERMAL HYSTERESIS CHARACTERISTIC

[75] Inventors: Katsumi Ishikawa; Akio Ozawa, both of Tokyo, Japan

[73] Assignee: Pioneer Electronic Corporation, Tokyo, Japan

[21] Appl. No.: 776,810

[22] Filed: Mar. 11, 1977

[30] Foreign Application Priority Data

Mar. 12, 1976  Japan ................................ 51-26060

[51] Int. Cl.² ............................................ H02H 5/04
[52] U.S. Cl. ................................ 361/103; 330/207 P
[58] Field of Search .................. 361/103; 330/207 P; 307/310, 290

[56] References Cited

U.S. PATENT DOCUMENTS

| | | | |
|---|---|---|---|
| 3,558,987 | 1/1971 | Lewis | 361/103 |
| 3,906,310 | 9/1975 | Esashika | 361/103 |
| 3,916,263 | 10/1975 | Abbott | 361/103 |

FOREIGN PATENT DOCUMENTS

3,536   3/1968   Japan ................................ 307/290

Primary Examiner—Harry E. Moose, Jr.
Attorney, Agent, or Firm—Sughrue, Rothwell, Mion, Zinn and Macpeak

[57] ABSTRACT

A Schmitt trigger circuit including transistors Q12 and Q13 having a common emitter resistor R3 is thermally coupled to a power amplifier A in a monolithic IC chip, and the base of Q12 is biased at a cutoff potential under normal operating conditions. When the temperature rises to a first predetermined level $V_{BE}$ of Q12 drops below its biasing potential owing to the temperature characteristic of Q12, whereby Q12 conducts, which cuts off Q13 and, through transistor Q14, disables the amplifier. The common emitter feedback provides a thermal hysteresis characteristic, whereby Q12 is not cut off again until the temperature drops below a second predetermined level.

6 Claims, 3 Drawing Figures

TEMPERATURE SENSING PROTECTION CIRCUIT FOR IC POWER CHIP HAVING THERMAL HYSTERESIS CHARACTERISTIC

BACKGROUND OF THE INVENTION

This invention relates to a temperature sensing protective circuit for a power level Integrated Circuit chip or the like, having a thermal hysteresis characteristic.

Heretofore, in a power level IC chip or the like which has no internal protective circuit to guard against overheating, an external fuse or electronic protection circuit must be provided. Where a fuse in used, it must be replaced by a new one after every function, and where an electronic protection circuit is used a complicated circuit is required whose operation may distort the IC output. The latter disadvantage may not be avoided even if the IC has an internal protective circuit.

SUMMARY OF THE INVENTION

An object of the present invention is to provide a temperature detecting protective circuit which is simple in construction and can be provided either integral with or separate from a power level IC chip or the like. According to the present invention, the temperature detection circuit comprises a Schmitt trigger circuit having a thermal hysteresis characteristic which is provided by utilizing the temperature characteristics of a first stage transistor in the Schmitt circuit. With this construction, the output signal of the protective circuit is in digital form, and is used as a control signal to shut down the utilization means, such as a power level IC chip, when the temperature thereof reaches a dangerous or damaging level.

DETAILED DESCRIPTION OF THE PREFERRED EMBODIMENT

Figure 1:
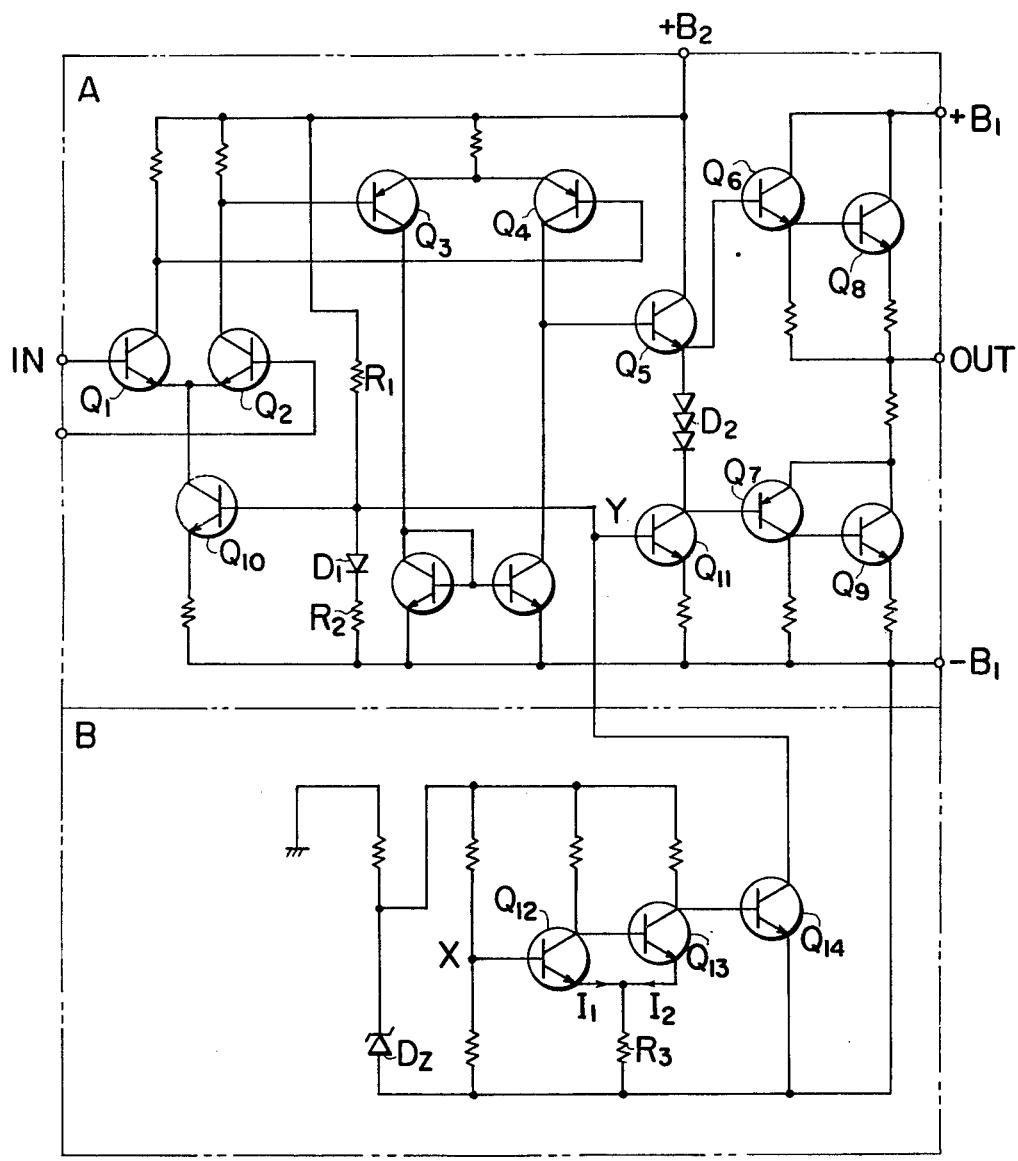
FIG. 1 shows a schematic circuit diagram of a power level IC having an integral, temperature sensing protective circuit according to the present invention.

In FIG. 1, the IC comprises a power amplifier portion A and a detecting circuit portion B. The amplifier portion employs a double power supply $+B_1$ and $-B_1$, and includes an output capacitorless (OCL) amplifier. In the OCL amplifier, transistors $Q_1$, $Q_2$, $Q_3$ and $Q_4$ constitute a differential amplifier, transistor $Q_5$ is a predrive transistor, and transistors $Q_6$, $Q_7$, $Q_8$ and $Q_9$ constitute the power output stage. Transistors $Q_{10}$ and $Q_{11}$ form a constant current load to which a biasing potential is applied through resistors $R_1$ and $R_2$ and a diode $D_1$. A stacked diode $D_2$ provides $V_{BE}$ temperature compensation for the power stage transistors.

In the detection circuit portion B, a Schmitt trigger circuit is constituted by transistors $Q_{12}$ and $Q_{13}$, which have a common emitter resistor $R_3$. The emitter current $I_1$ of transistor $Q_{12}$ and the emitter current $I_2$ of transistor $Q_{13}$ are such that $I_1 < I_2$, and the normal base potential of transistor $Q_{12}$ at point X is set at a value at which $Q_{12}$ is cutoff. A Zener diode $D_Z$ establishes the fixed potential at point X. A transistor switch $Q_{14}$ is controlled by the Schmitt circuit, and its collector is connected to a point Y corresponding to the bases of the transistors $Q_{10}$ and $Q_{11}$ in the power amplifier portion A.

The power amplifier and the detection circuit are integrated in a common chip whereby the power stage transistors $Q_8$ and $Q_9$ and the Schmitt circuit transistor $Q_{12}$ are thermally coupled.

The transistors $Q_{12}$ and $Q_{13}$ are made of silicon, their $V_{BE}$ temperature characteristic (base - emitter voltage when either transistor is conductive) is 2mV/° C, and $V_{BE}$ is 0.65 V at a normal operating temperature of 25° C.

When the potential at point X is such that $V_{BE}'$ of transistor $Q_{12}$ (voltage actually applied across the base and emitter) is below 0.65V at normal temperatures, transistor $Q_{12}$ is cutoff and transistor $Q_{13}$ is conductive, resulting in transistor $Q_{14}$ being blocked or cutoff. The potential at point Y is thus determined by the resistors $R_1$ and $R_2$ and the diode $D_1$, and the power amplifier portion A operates in a normal manner whereby an audio signal applied to the input IN is amplified to a sufficient extent to drive an external loudspeaker load connected to the output terminal OUT.

In this state, when the collector-base junctions of transistors $Q_8$ and $Q_9$ become overheated due to an excessive output signal or the like, the same heat conditions are applied to transistor $Q_{12}$ in the detection circuit, reducing the $V_{BE}$ thereof. When the potential difference at point X with respect to $-B_1$ is set at 0.5 V and the voltage drop $I_2R_3$ across resistor $R_3$ due to the emitter current $I_2$ of transistor $Q_{13}$ is set at 0.1 V, $V_{BE}'$ of transistor $Q_{12}$ becomes 0.4 V. Thus, transistor $Q_{12}$ becomes conductive when $V_{BE}$ reaches 0.4 V. The temperature at which $V_{BE}$ becomes 0.4 V can be calculated to be 150° C on the basis of a 2mV/° C temperature characteristic, as mentioned above. Therefore, when the temperature of transistors $Q_8$ and $Q_9$ in the power output stage becomes 150° C, $V_{BE}$ of transistor $Q_{12}$ equals $V_{BE}'$, which causes $Q_{12}$ to become conductive. This blocks or cuts off transistor $Q_{13}$, which in turn renders transistor $Q_{14}$ conductive. Therefore, point Y of transistors $Q_{10}$ and $Q_{11}$ becomes effectively grounded, and the amplifier portion ceases operation.

In this state, transistor $Q_{14}$ is also thermally influenced, and $V_{BE}$ thereof becomes around 0.4 V. However, since transistor $Q_{12}$ is conductive and the collector-emitter voltage thereof is about 0.1 V, substantially all of the current flows through transistor $Q_{12}$ whereby transistor $Q_{13}$ is maintained in a cutoff state.

When transistor $Q_{12}$ is conductive, a voltage drop $I_1R_3$ is produced across resistor $R_3$. Since the relation between the emitter currents $I_1$ and $I_2$ of transistors $Q_{12}$ and $Q_{13}$ is such that $I_1 < I_2$, as mentioned above, the voltage drop $I_1R_3$ is smaller than $I_2R_3$ whereby the emitter potential of $Q_{12}$ is lowered by an amount $I_0R_3$, where $I_0 = I_2 - I_1$. In order to render transistor $Q_{12}$ non-conductive again, it is thus necessary to raise the temperature sensitive $V_{BE}$ to a value higher than $0.4V + I_0R_3$. In other words, $I_0R_3$ is a hysteresis voltage.

Assuming that $I_0R_3 = 50$mV, the corresponding temperature difference is 25° C according to the $V_{BE}$ temperature characteristic of 2mV/° C. $V_{BE}$ increases to 0.45V when the temperature drops to 125° C(150° − 25° C) and, when $V_{BE}$ slightly exceeds 0.45V, $V_{BE}$ becomes greater than $V_{BE}'$. At such time transistor $Q_{12}$ is cutoff again, and as a result, transistors $Q_{13}$ and $Q_{14}$ become conductive and non-conductive, respectively. This returns the potential at point Y to its normal value, to thereby restore the power amplifier portion A to normal operation.

As will be clear from the foregoing, the detection circuit B is provided with a hysteresis characteristic whereby the temperatures at which transistor $Q_{12}$ is turned on and turned off, respectively, are different, the turn off temperature being the lower.

Figure 2A:
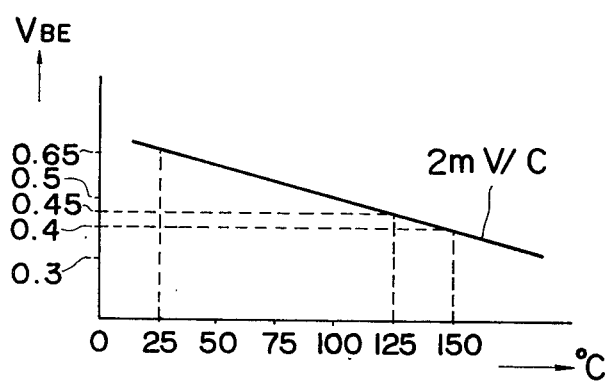
FIG. 2a shows the temperature characteristic for the sensing transistor in FIG. 1.
Figure 2B:
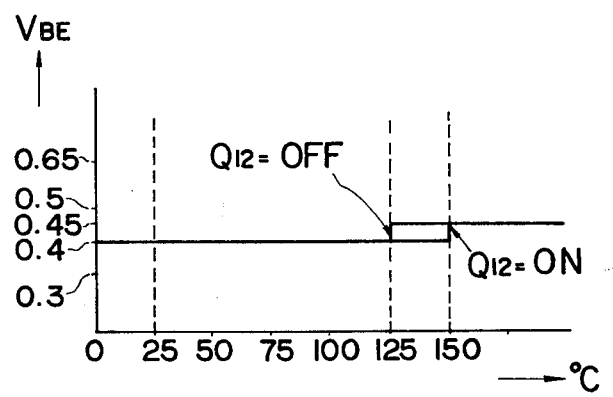
FIG. 2b shows the thermal hysteresis characteristic of the protective circuit.

FIG. 2A shows the $V_{BE}$ temperature dependency characteristic of transistor $Q_{12}$, which has a gradient of 2mV/° C. The values of $V_{BE}$ at 150° C and 125° C are 0.4 V and 0.45 V, respectively. FIG. 2B shows a hysteresis curve of the ON and OFF states of transistor $Q_{12}$, from which is can be seen that $Q_{12}$ is turned on and off at $V_{BE}'$ corresponding to $V_{BE}$ in FIG. 2a but different in value.

Describing again the operation of the circuit with reference to FIGS. 2A and 2B, $V_{BE}$ and $V_{BE}'$ are 0.65 V and 0.4 V, respectively, at 25° C, and therefore transistor $Q_{12}$ is cutoff. This state holds until the temperature reaches 150° C, at which time $V_{BE}$ becomes 0.4 V whereby $V_{BE} = V_{BE}'$. This causes transistor $Q_{12}$ to turn on and the power amplifier portion A to shut down. With $Q_{12}$ on, $V_{BE}'$ becomes 0.45V.

After shut down the temperature gradually lowers, and when it reaches 125° C, $V_{BE}$ becomes 0.45 V. When the temperature drops slightly below 125° C, $V_{BE}$ becomes larger than $V_{BE}'$ and transistor $Q_{12}$ is again cutoff, whereby $V_{BE}'$ drops to 0.4V, i.e. $V_{BE} >> V_{BE}'$ causing $Q_{12}$ to become even more strongly cutoff. Accordingly, the thermal hysteresis range extends from 125° to 150° C.

The above description is for the case where the hysteresis voltage $I_0 R_3$ ($I_0 = I_2 - I_1$) is 50mV. When this voltage is larger than 50mV the variation of $V_{BE}'$ will also become larger. Therefore, the difference between the temperatures at which transistor $Q_{12}$ is turned on and off, respectively, becomes larger than in the described example. Further, the base potential of $Q_{12}$ at point X, and thus $V_{BE}'$, may have a temperature dependency. If the direction of such dependency is the same as that of $V_{BE}$, which is negative as shown in FIG. 2A, the coefficiancy thereof should be smaller than that of $V_{BE}$, since the on-off switching frequency will otherwise become undesirably high owing to the smaller or decreased difference between the on and off temperatures. If the direction of temperature dependency of $V_{BE}'$ is positive, however, there is no problem because the switching temperature difference would then increase with temperature.

In the described embodiment the detection circuit B responds to a predetermined temperature by providing a control signal to cutoff the transistors constituting the constant current load, which terminates the operation of the power amplifier A. Instead of this construction, however, the amplifier operation may be terminated by other means, such as switching off the power supply circuit, interrupting the audio input signal, etc.

In the described embodiment the power amplifier portion A and the detection circuit B are incorporated in a monolithic IC on the same chip, which arrangement provides a very high response speed. It may also be possible to thermally couple the power amplifier portion A to the detection circuit B in hybrid manner, however. Further, the protective function of the detection circuit B is not limited to the specific power amplifier disclosed, but could be used with equal facility to prevent the overheating of a single power transistor, a transformer, or a constant voltage IC, for example.

In addition, the disclosed Schmitt circuit provides a hysteresis characteristic by positively feeding the output of the last stage transistor back to the emitter of the first stage transistor, to thereby change the emitter potential of the latter. The feedback arrangement is not limited to this configuration, however, and it would also be possible, for example, to effect a positive feedback to the base of the first stage transistor.

What is claimed is:

1. Thermal protection circuit for an operating circuit, comprising:
   (a) A Schmitt trigger circuit including a first transistor having a temperature dependent base-emitter voltage, a second transistor operatively coupled to and conductively controlled by the output of the first transistor, and a feedback path from the second to the first transistor,
   (b) Means for applying a fixed biasing potential to the base of the first transistor of such magnitude to maintain the first transistor in a non-conductive state under normal operating conditions of said operating circuit,
   (c) Means thermally coupling the first transistor with the operating circuit, and
   (d) Means coupled between the trigger circuit and the operating circuit for disabling the latter in response to a reversal in the conductive states of the first and second transistors, whereby the first and second transistors become conductive and non-conductive, respectively, when the temperature of the operating circuit rises to a first predetermined level at which the base-emitter voltage of the first transistor drops below its effective biasing potential, and wherein the first transistor is again cutoff when the temperature of the operating circuit drops to a second predetermined level.

2. A thermal protection circuit as defined in claim 1, wherein the feedback path includes directly coupled emitters and a common emitter resistor, and whereby the circuit is so designed that the emitter current of the first transistor is less than the emitter current of the second transistor, whereby a termal hysteresis characteristic is provided.

3. A thermal protection circuit as defined in claim 1, wherein the operating circuit and the protection circuit are incorporated in a monolithic IC chip.

4. A thermal protection circuit as defined in claim 2, wherein the operating circuit and the protection circuit are incorporated in a monolithic IC chip.

5. A thermal protection circuit as defined in claim 2, wherein the means for applying a biasing potential comprises a Zener diode.

6. A thermal protection circuit as defined in claim 4, wherein the means for applying a biasing potential comprises a Zener diode.

* * * * *